United States Patent
Qin et al.

(10) Patent No.: US 11,398,523 B2
(45) Date of Patent: Jul. 26, 2022

(54) ARRAY SUBSTRATE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Chengjie Qin, Beijing (CN); Chunyan Xie, Beijing (CN); Tao Wang, Beijing (CN); Song Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 100 days.

(21) Appl. No.: 16/630,654

(22) PCT Filed: Jan. 23, 2019

(86) PCT No.: PCT/CN2019/072841
§ 371 (c)(1),
(2) Date: Jan. 13, 2020

(87) PCT Pub. No.: WO2020/150925
PCT Pub. Date: Jul. 30, 2020

(65) Prior Publication Data
US 2020/0286948 A1    Sep. 10, 2020

(51) Int. Cl.
H01L 27/14    (2006.01)
H01L 27/15    (2006.01)
H01L 27/12    (2006.01)

(52) U.S. Cl.
CPC .......... *H01L 27/156* (2013.01); *H01L 27/127* (2013.01); *H01L 27/1255* (2013.01)

(58) Field of Classification Search
CPC .. H01L 27/156; H01L 27/1255; H01L 27/127
USPC ................................. 257/43, 59, 72
See application file for complete search history.

(56) References Cited

U.S. PATENT DOCUMENTS

| | | | |
|---|---|---|---|
| 9,491,870 B2* | 11/2016 | Park | H05K 3/361 |
| 9,698,206 B2* | 7/2017 | You | H01L 27/326 |
| 10,553,652 B2* | 2/2020 | Kim | H01L 51/5012 |
| 10,811,480 B2* | 10/2020 | Lee | H01L 51/5281 |
| 2016/0043117 A1 | 2/2016 | Guo | |
| 2016/0087023 A1 | 3/2016 | Maeda | |
| 2016/0268354 A1* | 9/2016 | Xiong | H01L 27/3246 |
| 2017/0250236 A1 | 8/2017 | Xiong et al. | |
| 2018/0197929 A1* | 7/2018 | Cho | H01L 27/3258 |

(Continued)

FOREIGN PATENT DOCUMENTS

| | | |
|---|---|---|
| CN | 103500730 A | 1/2014 |
| CN | 204011422 U | 12/2014 |
| CN | 105552107 A | 5/2016 |

(Continued)

*Primary Examiner* — Tan N Tran
(74) *Attorney, Agent, or Firm* — The Webb Law Firm

(57) ABSTRACT

At least one embodiment of the present disclosure relates to an array substrate and a manufacturing method thereof, a display panel and a display device. The array substrate includes: a pixel region including a first light emitting material layer; a hole region; a separating region including a separating structure, wherein the separating structure includes at least one first groove, and the separating structure is configured to separating the first light emitting material layer from the hole region through the first groove.

20 Claims, 5 Drawing Sheets

(56) References Cited

U.S. PATENT DOCUMENTS

2018/0301521 A1* 10/2018 Yang .................. H01L 27/3211

FOREIGN PATENT DOCUMENTS

| CN | 108919545 A | 11/2018 |
| CN | 109037480 A | 12/2018 |
| CN | 109061968 A | 12/2018 |
| JP | 2010086814 A | 4/2010 |

* cited by examiner

ARRAY SUBSTRATE AND MANUFACTURING METHOD THEREOF, DISPLAY PANEL AND DISPLAY DEVICE

CROSS-REFERENCE TO RELATED APPLICATIONS

The present application is a U.S. National Stage Application under 35 U.S.C. § 371 of International Patent Application No. PCT/CN2019/072841, filed on Jan. 23, 2019, the disclosure of which is incorporated by reference herein in its entirety.

TECHNICAL FIELD

The present disclosure relates to the field of display technologies, and in particular, to an array substrate and a manufacturing method thereof, a display panel, and a display device.

BACKGROUND

With the rapid development of display technologies, displays are widely used in more and more fields. At present, cameras of mobile terminals such as mobile phones are mostly disposed in non-display areas of a screen, such as a bezel of the screen, which enlarges the size of the bezel.

In the related art, in order to reduce the size of the bezel, the camera is disposed in a display area, for example, by digging a hole in the display area and disposing the camera at a corresponding position of the hole.

SUMMARY

According to some embodiments of the present disclosure, there is provided an array substrate comprising: a first light emitting material layer located at a pixel region; and a separating structure located at a separating region, wherein the separating structure comprises at least one first groove, and the separating structure is configured to separating the first light emitting material layer from a hole through the first groove, wherein the hole is located at a hole region, the separating region surrounds the hole region, and the pixel region surrounds the separating region.

In some embodiments, the array substrate further comprises a substrate structure, the first light emitting material layer and the separating structure are located on the substrate structure, and an angle between at least one side surface of the separating structure and a bottom surface of the separating structure close to the substrate structure is less than or equal to 90°.

In some embodiments, a cross section of the first groove in a direction perpendicular to the substrate structure is a quadrilateral of which at least one base angle close to the substrate structure is less than or equal to 90°.

In some embodiments, the separating region comprises: a second light emitting material layer partially covering the separating structure and broken at at least one base angle of the first groove close to the substrate structure.

In some embodiments, the separating region further comprises: an anode material layer disposed between the second light emitting material layer and the separating structure.

In some embodiments, at least one base angle of the quadrilateral close to the substrate structure is in a range of 30° to 70°.

In some embodiments, the quadrilateral is a trapezoid.

In some embodiments, the separating region further comprises: an anode material layer at least partially covering the separating structure.

In some embodiments, the separating further comprises: a metal stack disposed around the hole region, and located between the separating structure and the hole region.

In some embodiments, the pixel region further comprises: a thin film transistor structure located between the first light emitting material layer and the substrate structure, the thin film transistor structure comprising a gate electrode, a source electrode, and a drain electrode; wherein the metal stack comprises a first metal layer and a second metal layer made of the same materials as the gate electrode and source electrode of the thin film transistor structure, respectively.

In some embodiments, the pixel region further comprises: a capacitor structure located between the first light emitting material layer and the substrate structure, and between the separating structure and the thin film transistor structure, wherein the capacitor structure comprises a first electrode layer and a second electrode layer, and the first electrode layer is made of the same material as the gate electrode of the thin film transistor structure; wherein the metal stack comprises a third metal layer made of the same material as the second electrode layer of the capacitor structure.

In some embodiments, the separating structure further comprises: at least one second groove, a depth of which in a direction perpendicular to the substrate structure is less than that of the first groove, and an orthographic projection area of which on the substrate structure is smaller than that of the first groove on the substrate structure.

In some embodiments, the hole region has a hole that extends through the substrate structure.

According to some other embodiments of the present disclosure, a display panel is provided, comprising the array substrate according to any of the previous embodiments.

According to some further embodiments of the present disclosure, a display device is provided, comprising the display panel according to any of the previous embodiments.

According to still other embodiments of the present disclosure, there is provided a method of manufacturing an array substrate, comprising: forming a separating structure on one side of a substrate structure, wherein the separating structure is located in a separating region surrounding a hole region and is provided with at least one first groove; and forming a first light emitting material layer on the one side of the substrate structure, wherein the first light emitting material layer is located in a pixel region and is separated from the hole region through the first groove.

In some embodiments, a light emitting material layer is formed by an evaporation process, a portion of the light emitting material layer located in the pixel region serves as the first light emitting material layer, a portion of the light emitting material layer located in the separating region serves as a second light emitting material layer, and the second light emitting material layer partially covers the separating structure and is not formed at at least one base angle of the first groove close to the substrate structure.

In some embodiments, the second light emitting material layer is not formed at a sidewall of the first groove.

In some embodiments, the method of manufacturing further comprises: forming an anode material layer before forming the separating structure.

In some embodiments, the method of manufacturing further comprises: forming an anode material layer at least partially covering the separating structure, after forming the separating structure and before forming the light emitting material layer.

In some embodiments, the method of manufacturing further comprises: removing the second light emitting material layer covering the separating structure.

In some embodiments, the method of manufacturing further comprises: forming a metal stack located in the separating region, between the separating structure and the hole region, and comprising a first metal layer and a second metal layer.

In some embodiments, the method of manufacturing further comprises: forming a thin film transistor structure before forming the light emitting material layer, the thin film transistor structure being located in the pixel region and comprising a gate electrode, a source electrode, and a drain electrode; wherein the first metal layer and the second metal layer of the metal stack are formed through the same patterning process with the gate electrode and the source electrode of the thin film transistor, respectively.

In some embodiments, the method of manufacturing further comprises: forming a capacitor structure, wherein the capacitor structure is located in the pixel region, between the thin film transistor structure and the separating region, and comprises a first electrode layer and a second electrode layer, wherein the first electrode layer is formed through the same patterning process with the gate electrode of the thin film transistor structure; wherein the metal stack further comprises a third metal layer, and the third metal layer is formed through the same patterning process with a second electrode of the capacitor structure.

In some embodiments, the method of manufacturing further comprises: etching the hole region to form a hole.

Other features of the present disclosure and advantages thereof will become apparent from the following detailed description of exemplary embodiments thereof with reference to the accompanying drawings.

BRIEF DESCRIPTION OF THE DRAWINGS

The accompanying drawings, which constitute a part of the specification, illustrate the embodiments of the present disclosure and, together with the description, serve to explain the principles of the present disclosure.

The present disclosure may be more clearly understood from the following detailed description, taken with reference to the accompanying drawings, in which.

Please be appreciated that, the sizes of various portions shown in the accompanying drawings are not drawn to actual scale. Furthermore, identical or similar reference numerals are used to refer to identical or similar members.

DETAILED DESCRIPTION

Various exemplary embodiments of the present disclosure will be described in detail with reference to the accompanying drawings in the following. The following description of the exemplary embodiments is merely illustrative in nature and is in no way intended to limit this disclosure, its application, or uses. The present disclosure may be implemented in many different forms and is not limited to the embodiments described herein. These embodiments are provided merely for making the present disclosure thorough and complete, and sufficiently expressing the scope of the present disclosure to one of ordinary skill in the art. It should be noted that the relative arrangement of the components and steps set forth in these embodiments are interpreted to be merely illustrative instead of restrictive, unless it is specifically stated otherwise.

All terms (including technical or scientific terms) used in this disclosure have the same meanings as understood by one of ordinary skill in the art, unless otherwise specifically defined. It should also be understood that the terms defined in common dictionaries should be interpreted as having meanings consistent with their meanings in the context of the relevant technologies, but should not be interpreted with idealized or extremely formalized meanings, unless otherwise expressly defined herein.

Techniques, methods and apparatus as known by one of ordinary skill in the relevant art may not be discussed in detail, but are intended to be regarded as a part of the specification where appropriate.

In the related art, holes are dug in the display area, so that cameras are arranged at corresponding positions of the holes, thereby achieving a full screen. However, if the light emitting material around the hole fails to be effectively separated from the light emitting material in the pixel region, failure of the light emitting material around the hole may extend to the pixel region, resulting in failure of normal display in the pixel region.

In view of this, the present disclosure provides an array substrate capable of effectively preventing extension of the failure of the light emitting material around the hole.

According to some embodiments of the present disclosure, there is provided an array substrate comprising: a pixel region comprising a first light emitting material layer; a hole region; a separating region comprising a separating structure, wherein the separating structure comprises at least one first groove, and the separating structure is configured to separating the first light emitting material layer from the hole region through the first groove.

Figure 1:
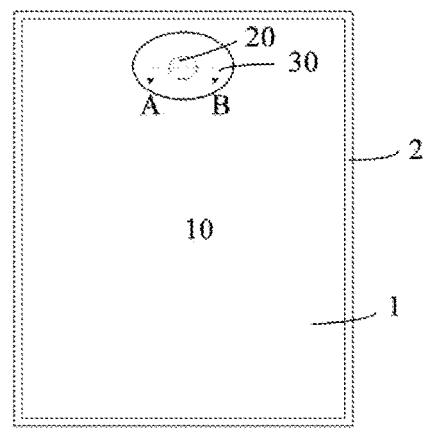
FIG. 1 is a top view illustrating an array substrate according to an embodiment of the present disclosure.

FIG. 1 is a top view illustrating an array substrate according to an embodiment of the present disclosure. As shown in FIG. 1, the array substrate comprises a display area 1 and a bezel 2. The display area 1 includes a pixel region 10, a hole region 20, and a separating region 30.

As shown in FIG. 1, the separating region 30 surrounds the hole region 20, and the pixel region 10 surrounds the separating region 30.

In some embodiments, the hole region 20 has a hole. As shown in FIG. 1, the hole is located in the upper half of the display area and has a circular shape. It should be understood that the location and shape of the hole on the display area are not limited to that shown in FIG. 1. For example, the hole may be located anywhere in the display area. The hole can also be an ellipse or other polygons such as a square and a rhombus.

The size of the hole is set according to the requirement on light transmission quantity. For example, a diameter of the hole may be set in a range of 1 to 6 mm. A depth of the hole can also be set according to the requirement on light transmission quantity. For example, the hole may be a through-hole, i.e. extending through the base substrate. This ensures that sufficient ambient light enters a device such as a camera through the hole. Of course, a blind hole is also possible if the requirement on light transmission quantity can be met without a through-hole.

Figure 2A:
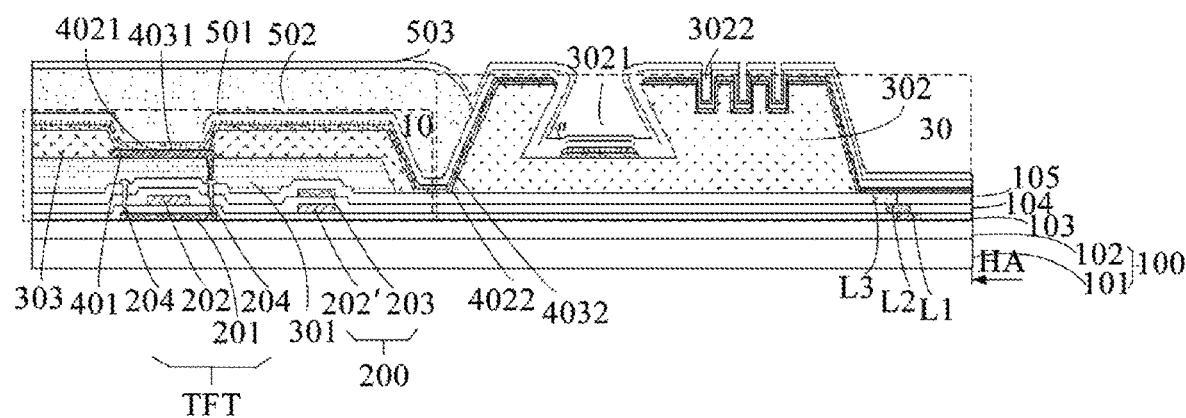
FIG. 2A is a sectional view illustrating an array substrate according to an embodiment of the present disclosure.

FIG. 2A is a sectional view illustrating an array substrate according to an embodiment of the present disclosure. FIG. 2A is a sectional view of the array substrate taken along a line AB in the top view shown in FIG. 1. In FIG. 2A, the through-hole penetrates the base substrate. FIG. 2A shows a sectional view of the structure on one side of the through-hole, i.e., the display area indicated by HA.

As shown in FIG. 2A, the array substrate includes a pixel region 10 and a separating region 30. Functional layers of the pixel region 10 and the separating region 30 are located on the substrate structure 100. As shown in FIG. 2A, the substrate structure 100 includes a base substrate 101. In some embodiments, the substrate structure 100 further includes a buffer layer 102 formed on the base substrate 101. The material of the buffer layer 102 may be inorganic or organic. For example, the material of the buffer layer 102 may include at least one of silicon oxide, silicon nitride, or polyimide.

As shown in FIG. 2A, the array substrate may further include a first insulating layer 103, a second insulating layer 104 and an intermediate layer 105 in this order on the substrate structure 100. The first insulating layer 103, the second insulating layer 104, and the intermediate layer 105 may be of the same material or different materials, and for example, the material may include at least one of a silicon oxide or a silicon nitride.

As shown in FIG. 2A, the pixel region 10 may include a thin film transistor structure TFT. The TFT structure includes an active layer 201, a gate electrode 202, and a source/drain electrode 204. As shown in FIG. 2A, the TFT structure is located over the substrate structure. The various electrodes of the TFT structure are separated by insulating layers.

In some embodiments, the material of the gate electrode 202 may include at least one of conductive materials such as molybdenum, copper, aluminum, gold, silver, or titanium, for example, various alloys of the above materials, or a stack of the above materials. The material of the source/drain electrode 204 may also include at least one of conductive materials such as molybdenum, copper, aluminum, gold, silver, or titanium, for example, various alloys of the above materials, or a stack of the above materials.

As shown in FIG. 2A, the pixel region 10 may further include a capacitor structure 200. The capacitor structure 200 includes a first electrode layer 202' and a second electrode layer 203. In some embodiments, the first electrode layer 202' is of the same material as the gate electrode 202 of the TFT structure. The material of the second electrode layer 203 may include at least one of conductive materials such as molybdenum, copper, aluminum, gold, silver, or titanium, for example, various alloys of the above materials, or a stack of the above materials.

The pixel region 10 may further include a light emitting device layer. The light emitting device layer includes an anode material layer 401, a first light emitting material layer 4021, and a first cathode material layer 4031. As shown in FIG. 2A, the anode material layer 401 includes a plurality of anode units (only one anode unit is shown in the figure) separated by a pixel defining layer 303. The material of the anode material layer may include a conductive oxide such as indium tin oxide, indium zinc oxide etc.; a reflective metal such as silver, aluminum etc.; or a multilayer conductive material comprising a conductive oxide and a reflective metal. The material of the cathode material layer includes at least one of Li, Ag, Ca, Al, or Mg.

The light emitting device layer is located on a side of the TFT structure and the capacitor structure away from the substrate structure. In other words, both the TFT structure and the capacitor structure are located between the light emitting device layer and the substrate structure. As shown in FIG. 2A, the pixel defining layer 303 is located above the capacitor structure 200. The anode unit is located above the TFT structure.

In some embodiments, a support layer (also referred to as a planarization layer) 301 is disposed between the light emitting device layer and the TFT structure. The support layer 301 provides a flat surface for the light emitting device layer. The material of the support layer 301 includes at least one of polymer materials such as polymethyl methacrylate, polyimide.

The aforementioned TFT structure, capacitor structure, light emitting device layer, if any, are located in the pixel region. The pixel region is separated from the hole region through separating region. As shown in FIG. 2A, the separating region 30 includes a separating structure 302.

The separating structure 302 is also located above the substrate structure 100, for example above the intermediate layer 105. As shown in FIG. 2A, the TFT structure and the capacitor structure in the pixel region are both located at an end of the separating structure 302 away from the hole. The capacitor structure may be located between the separating structure 302 and the TFT structure.

In some embodiments, the separating structure 302 is a single layer structure. Compared with a laminated structure, the single-layer structure has higher adhesion and stability. The material of the separating structure 302 can be a negative photoresist, which is easy to implement in terms of process.

In some other embodiments, an angle between at least one side surface of the separating structure 302 and its bottom surface close to the substrate structure 100 is less than or equal to 90°, as shown in FIG. 2A. Such a separating structure has higher adhesive force and stability on the substrate structure because the width of the lower bottom is greater than that of the upper bottom. It should be understood that, according to actual needs, the angle between at least one side surface of the separating structure 302 and its bottom surface close to the substrate structure 100 may also be set to be less than or equal to 85° or 95°.

In order to effectively separating the pixel region from the hole, the separating structure 302 has at least one first groove 3021. In some embodiments, the cross-section of the first groove 3021 in a direction perpendicular to the substrate structure 100 is a quadrilateral, at least one base angle of which close to the substrate structure 100 is less than or equal to 90°. It should be understood that the quadrilateral may be a strict quadrilateral or may be an approximate quadrilateral. For example, each base angle of the quadrilateral may be a rounded corner, and each side may be irregularly shaped, such as a sawtooth or a circular arc. It should be noted that a too large base angle of the quadrilateral may affect the separating effect between the pixel region and the hole region, and a too small base angle of the quadrilateral may result in poor structural stability of the groove and easy collapse of the groove. Compared with a groove with a larger or smaller base angle, a groove with a base angle in a proper angle range can more effectively separating the pixel region from the hole region, and the groove is guaranteed to have good structural stability. For example, the base angle α may range from 30° to 70°. For example, the base angle α may be also in a range of 25° to 75°.

FIG. 2A shows a case where the first groove 3021 is a trapezoidal groove, that is, the cross section of the first groove in a direction perpendicular to the substrate structure is trapezoidal. It should be understood that the trapezoid may be strictly trapezoidal or may be approximately trapezoidal. For example, the trapezoidal groove has an upper bottom width in a range of 2 to 10 microns, a lower bottom width in a range of 4 to 25 microns, and a height in a range of 2 to 5 microns. In such a trapezoid groove, since the base angle close to the substrate structure is smaller, it can more effectively separating the pixel region from the hole region.

In some embodiments, the separating structure 302 also has at least one second groove 3022. As shown in FIG. 2A, the second groove 3022 is a rectangular groove, that is, the second groove has a rectangular cross-section in a direction perpendicular to the substrate structure. As can also be seen from FIG. 2A, the depth of the second groove 3022 is less than that of the first groove 3021. The diameter of the second groove 3022 is smaller than that of the first groove 3021, that is, the orthographic projection area of the second groove 3022 on the substrate structure 100 is smaller than that of the first groove 3021 on the substrate structure 100. The existence of the second groove can prolong the packaging distance around the hole, and is favorable for improving reliability of the array substrate. It should be understood that the shape of the second groove is not limited to the rectangular shape shown in FIG. 2A, but may be other shapes such as a trapezoidal shape.

As mentioned above, the separating between the pixel region and the hole region is embodied as the separating between the light emitting material layer of the pixel region and the hole. This prevents failure of the light emitting material around the hole from extending to the light emitting material in the pixel region.

As shown in FIG. 2A, the separating region 30 includes a second light emitting material layer 4022. The second light emitting material layer 4022 partially covers the separating structure 302 and is broken at at least one base angle of the first groove 3021 close to the substrate structure 100.

In some embodiments, the second light emitting material layer 4022 is not present at both base angles and sidewalls of the first groove 3021, as shown in FIG. 2A. In the first groove 3021, only a part of the area on the bottom is covered with the second light emitting material layer 4022.

As shown in FIG. 2A, the second cathode material layer 4032 is stacked with the second light emitting material layer 4022, also partially covers the separating structure 302, and is broken at the base angle of the first groove 3021.

The separating region 30 may also comprise a metal stack. As shown in FIG. 2A, the metal stack is located between the separating structure 302 and the hole. Because the metal stack has better heat resistance, the metal stack around the hole can protect its underlying devices, and reduce a heat influence generated on the display area around the hole during laser ablation or other etching processes and other influences.

The metal stack includes a first metal layer L1 and a second metal layer L2. In some embodiments, the first metal layer L1 and the second metal layer L2 are of the same material as the gate electrode 202 and the source electrode 204 of the TFT structure, respectively. As shown in FIG. 2A, the metal stack may further include a third metal layer L3. The material of the third metal layer L3 may be the same as the material of the second electrode layer 203 of the capacitor structure. The metal stack and the thin film transistor or capacitor structure are formed through the same patterning process, and thus have lower costs.

In some embodiments, the array substrate is further covered with an encapsulation structure for protecting the display area and preventing the display area from being corroded by water, oxygen, and the like. As shown in FIG. 2A, the encapsulation structure covering the pixel region 10 includes a first inorganic encapsulation layer 501, an organic encapsulation layer 502, and a second inorganic encapsulation layer 503, and the encapsulation structure covering the separating region 30 includes only the first inorganic encapsulation layer 501 and the second inorganic encapsulation layer 503. This can make the encapsulated display area comparatively flat.

The materials of the first inorganic encapsulation layer and the second inorganic encapsulation layer may be the same or different from each other, and may include at least one of silicon oxynitride (SiON), silicon nitride (SiNx), silicon dioxide ($SiO_2$), aluminum oxide ($Al_2O_3$), zinc oxide (ZnO), or titanium dioxide ($TiO_2$), for example. The material of the organic encapsulation layer may include at least one of polyimide, polyurethane, polypropylene, or the like. The film thickness of each encapsulating layer can be set according to actual needs, for example, the thickness of the inorganic encapsulating layer can be 0.2 to 1.5 micrometers.

Figure 2B:
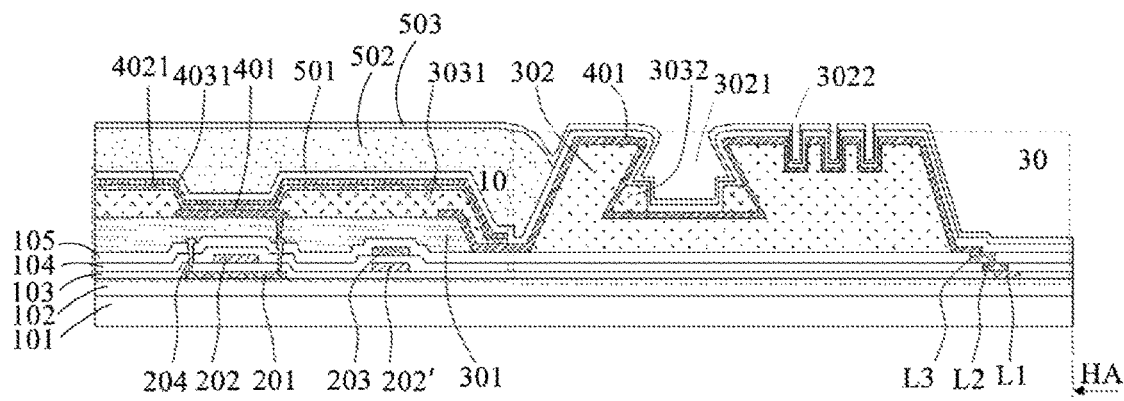
FIG. 2B is a sectional view illustrating an array substrate according to another embodiment of the present disclosure.

FIG. 2B is a sectional view illustrating an array substrate according to another embodiment of the present disclosure. FIG. 2B is also a sectional view of the array substrate taken along the line AB in the top view shown in FIG. 1.

FIG. 2B differs from FIG. 2A mainly in that: in FIG. 2A, the separating region 30 includes the second light emitting material layer 4022 partially covering the separating structure 302, but does not include the anode material layer 401; in FIG. 2B, the separating region 30 includes the anode material layer 401 covering the separating structure 302, but does not include the second light emitting material layer 4022. In addition to different arrangements of the light emitting material layer and the anode material layer, FIG. 2B differs from FIG. 2A in that, the structures at the base angle of the first groove 3021 of the separating structure 302 are also different. Only the differences between FIG. 2B and FIG. 2A will be described below, and the same parts will not be described again.

The anode material layer at least partially covers the separating structure. As shown in FIG. 2B, the anode material layer 401 completely covers the separating structure 302. That is, the anode material layer 401 is not separated from the hole by the separating structure 302. In FIG. 2B, the anode material layer 401 covers the sidewalls and the bottom of the first groove 3021, including the base angle of the first groove 3021. In some embodiments, the anode material layer 401, as a fourth metal layer of the metal stack, may further protect its underlying devices.

In FIG. 2B, since the first light-emitting material layer 4021 is far from the hole, even if the base angle of the first groove 3021 of the separating structure 302 is large, for example, 80°, it is possible to achieve sufficient separating of the first light emitting material layer from the hole by the separating structure, and prevent failure of the light emitting material around the hole from extending to the light emitting material in the pixel region.

As can also be seen from FIG. 2B, in addition to the presence of the pixel defining layer 3031 in the pixel region, a pixel defining layer 3032 is also present at the base angle of the first groove 3021 of the separating structure 302.

Figure 2C:
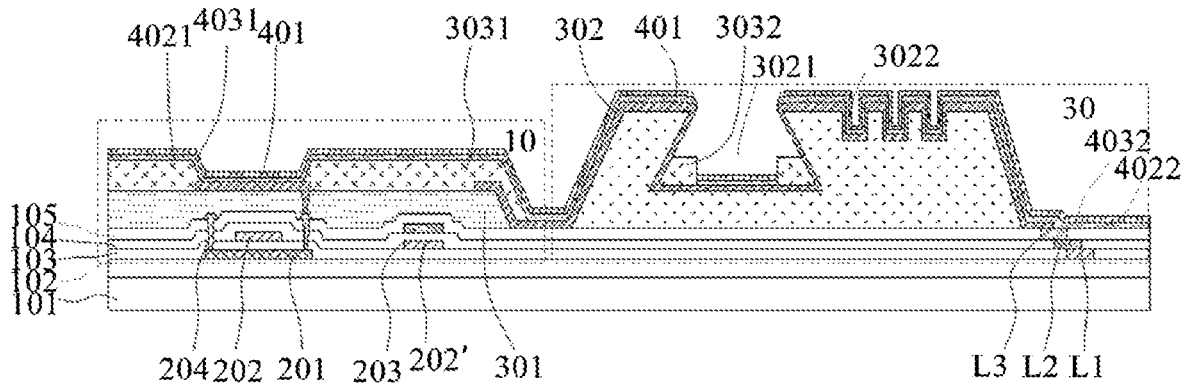
FIG. 2C is a sectional view illustrating an array substrate according to still another embodiment of the present disclosure.

FIG. 2C is a sectional view illustrating an array substrate according to still another embodiment of the present disclosure. FIG. 2C is also a sectional view of the array substrate taken along the line AB in the top view shown in FIG. 1.

FIG. 2C differs from FIG. 2B mainly in that: in FIG. 2C, the separating region 30 includes a second light emitting material layer 4022 partially covering the separating structure 302, in addition to the anode material layer 401 covering the separating structure 302.

The separating region in FIG. 2C differs from that in FIG. 2A mainly in that: in FIG. 2C, the separating region 30 further includes an anode material layer 401 between the second light emitting material layer 4022 and the separating structure 302; a pixel defining layer 3032 is also present at the base angle of the first groove 3021 of the separating structure 302.

According to the embodiments of the present disclosure, a method of manufacturing the array substrate is also provided. The method of manufacturing the array substrate comprises the following steps: forming a separating structure on one side of the substrate structure, wherein the separating structure is located in a separating region surrounding a hole region and is provided with at least one first groove; and forming a first light emitting material layer on the one side of the substrate structure, wherein the first light emitting material layer is located in a pixel region and is separated from the hole region through the first groove.

Figure 3A:
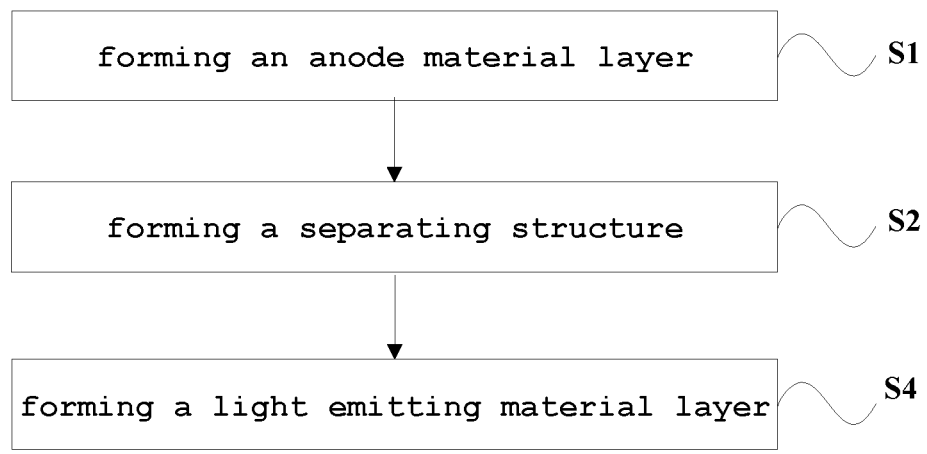
FIG. 3A is a flowchart illustrating a method of manufacturing an array substrate according to an embodiment of the present disclosure.
Figure 4:
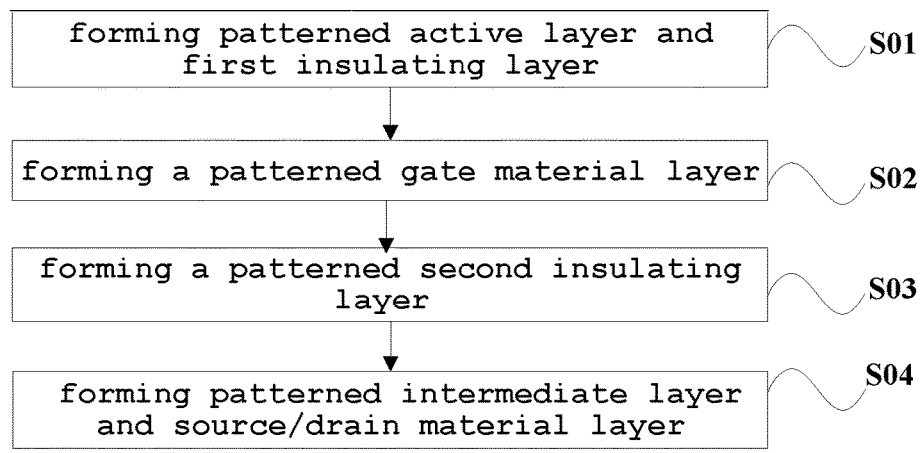
FIG. 4 is a flowchart illustrating a method of fabricating a TFT structure according to an embodiment of the present disclosure.

FIG. 3A is a flowchart illustrating a method of manufacturing an array substrate according to an embodiment of the present disclosure. FIG. 4 is a flowchart illustrating a method of manufacturing a TFT structure according to an embodiment of the present disclosure. FIGS. 5A-5E respectively are sectional views illustrating different manufacturing stages of an array substrate according to some embodiments of the present disclosure. A method of manufacturing an array substrate according to an embodiment of the present disclosure is described below with reference to FIGS. 3A, 4 and FIGS. 5A-5E, 2A.

As shown in FIG. 3A, forming a display area comprises: step S1 of forming an anode material layer; step S2 of forming a separating structure; step S4 of forming a light emitting material layer. In FIG. 3A, the anode material layer is formed before forming the separating structure.

In some embodiments, prior to forming the anode material layer, forming the display area further comprises forming a TFT structure. As shown in FIG. 4, forming the TFT structure comprises steps S01-S04.

Figure 5A:
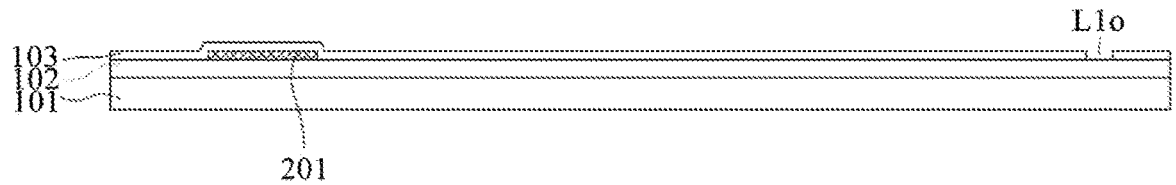
FIGS. 5A-5F respectively are sectional views illustrating different manufacturing stages of an array substrate according to some embodiments of the present disclosure.

In step S01, a patterned active layer 201 and a first insulating layer 103 are formed on the substrate structure, for example, to form the structure shown in FIG. 5A. As shown in FIG. 5A, the substrate structure includes a base substrate 101 and a buffer layer 102 thereon. The hole region is outside the right side of FIG. 5A and is not shown in the figure. The patterned active layer 201 is formed at a designated position on the buffer layer 102. The patterned first insulating layer 103 completely covers the active layer 201, partially covers the buffer layer 102 of the substrate structure 100, and exposes the buffer layer 102 at a position of an opening L1o of the first metal layer reserved for the metal stack. Patterning may be achieved by processes such as masking, exposing, developing, etching, and the like.

Figure 5B:
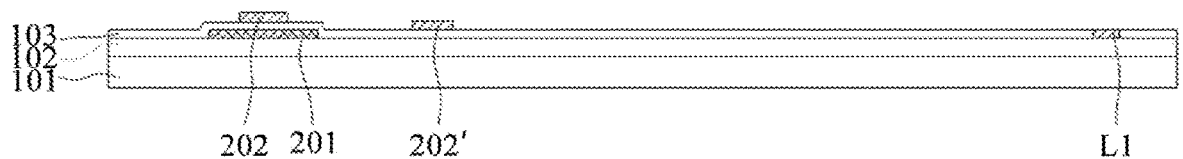
Figure 5C:
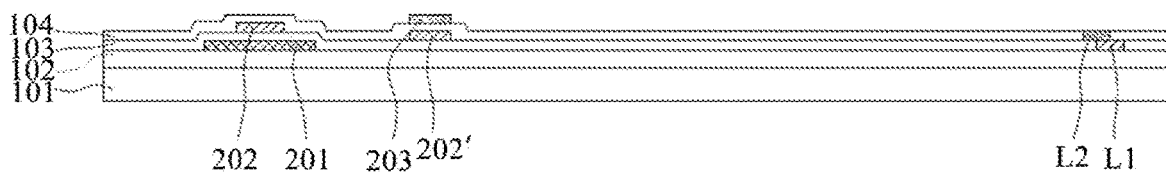
Figure 5D:
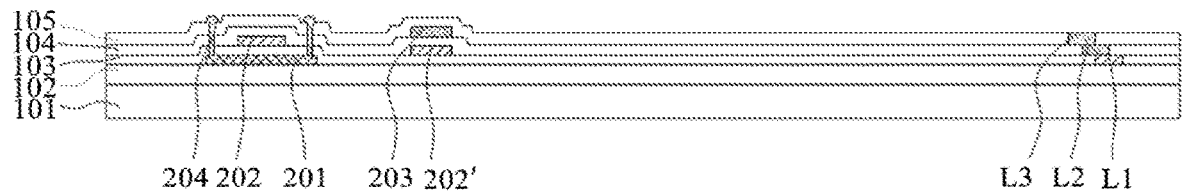

In step S02, a patterned gate material layer is formed, for example, to form the structure shown in FIG. 5B. As shown in FIG. 5B, the gate electrode 202 of the TFT structure is formed on the first insulating layer 103 at a position corresponding to the active layer 201. In some embodiments, the first metal layer L1 of the metal stack may be formed at the opening position at the same time. In some other embodiments, the first electrode 202' of the capacitor structure may also be formed simultaneously. That is, the first metal layer L1 of the metal stack, the first electrode 202' of the capacitor structure, and the gate electrode 202 of the TFT structure are formed through the same patterning process. In this way, the process can be simplified and the cost can be saved.

In step S03, a patterned second insulating layer 104 is formed. In some embodiments, the patterned second insulating layer 104 completely covers the gate electrode 202, partially covers the first insulating layer 103, and exposes the first insulating layer 103 at an opening position of the second metal layer reserved for the metal stack. The second electrode 203 of the capacitor structure is formed on the patterned second insulating layer 104 and the second metal layer L2 of the metal stack is formed at the opening position, for example, forming the structure shown in FIG. 5C. That is, the second metal layer L2 of the metal stack and the second electrode 203 of the capacitor structure are formed by the same patterning process, which can simplify the process and save the cost.

In step S04, patterned intermediate layer 105 and source/drain material layer are formed. In some embodiments, the patterned intermediate layer 105 partially covers the second insulating layer 104, and exposes the second insulating layer 104 at an opening position of the third metal layer reserved for the metal stack. At a position where the source/drain electrode is intended to be formed, a hole penetrating the intermediate layer 105, the second insulating layer 104, and the first insulating layer 103 up to the active layer 201 is etched. The source/drain electrode 204 is formed on the basis of the patterned intermediate layer 105 and a third metal layer L3 of the metal stack is formed at the opening position, for example forming the structure shown in FIG. 5D. That is, the third metal layer L3 of the metal stack and the source/drain electrode 204 of the TFT structure are formed by the same patterning process, which can simplify the process and save the cost.

Figure 5E:
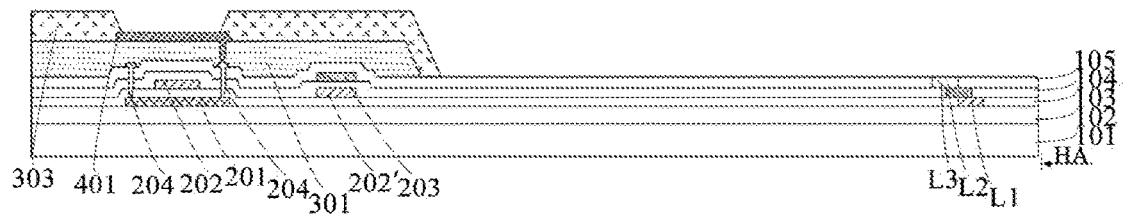

In step S1, a patterned anode material layer 401 is formed. The patterned anode material layer 401 is located at a position corresponding to the TFT structure, and is separated by the pixel defining layer 303, as shown in FIG. 5E.

A support layer 301 may also be formed on the intermediate layer 105 prior to forming the anode material layer. As shown in FIG. 5E, the support layer 301 is located over the TFT structure and the capacitor structure 200 to provide a planar surface for the formation of the anode material layer.

Figure 5F:
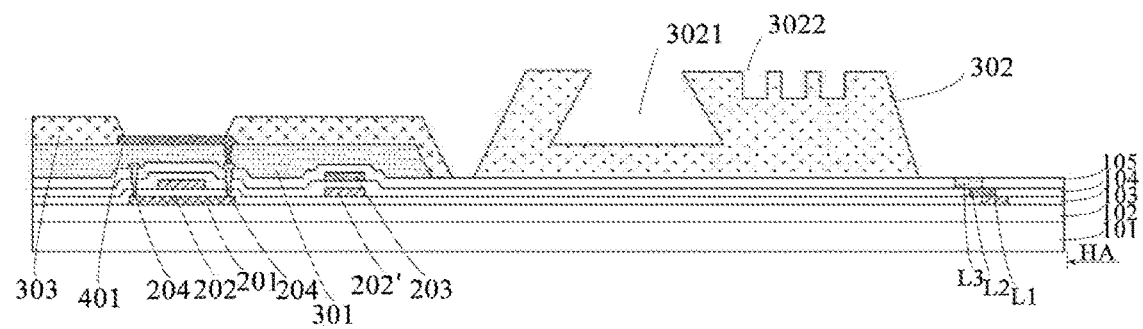

In step S2, the separating structure 302 is formed. In some embodiments, the separating structure 302 is a single negative photoresist layer. A patterned separating structure 302 is formed on the intermediate layer 105 by a patterning process. The separating structure is located between the hole region and the pixel region comprising the TFT structure and an anode layer 401E. The separating structure 302 has at least one first groove 3021. The first groove has a small base angle, ranging from 30° to 70°. As shown in FIG. 5F, the separating structure 302 further includes a plurality of rectangular grooves 3022.

In step S4, a light emitting material layer is formed. In some embodiments, the light emitting material layer is formed by an evaporation process. Because the first groove in the separating structure has a smaller base angle, the light emitting material layer will not be formed at the base angle of the first groove when forming the light emitting material layer by an evaporation process. In some embodiments, the light emitting material layer is not formed at sidewalls of the first groove either. As shown in FIG. 2A, the light emitting material layer may include a first light emitting material layer 4021 and a second light emitting material layer 4022. The first light emitting material layer 4021 is formed in the pixel region 10, and covers the anode material layer 401 and the pixel defining layer 303. The second light emitting material layer 4022 is formed in the separating region 30, and partially covers the separating structure 302. As shown in FIG. 2A, the second light emitting material layer 4022 is formed only on a part of the area on the bottom of the first groove 3021.

After the light emitting material layer is formed, a cathode material layer may also be formed by a similar evaporation process. As shown in FIG. 2A, the cathode material layer also includes a first cathode material layer 4031 and a second cathode material layer 4032, which are respectively stacked on the first light emitting material layer 4021 and the second light emitting material layer 4022, and are not formed at the base angle and the sidewalls of the first grooves 3021 either.

After the functional layers of the separating region and the pixel region are formed, the hole region is etched by laser ablation or other etching processes to form a hole.

In some embodiments, after the display area is formed, an encapsulation structure covering the display area may be further formed to protect the display area. For example, a first inorganic encapsulation layer 501, an organic encapsulation layer 502, and a second inorganic encapsulation layer 503 may be formed in this order in the pixel region to cover the pixel region. As shown in FIG. 2A, the encapsulation structure covering the separating region includes only the first inorganic encapsulation layer 501 and the second inorganic encapsulation layer 503. The encapsulation structure may also cover edges of the hole.

Figure 3B:
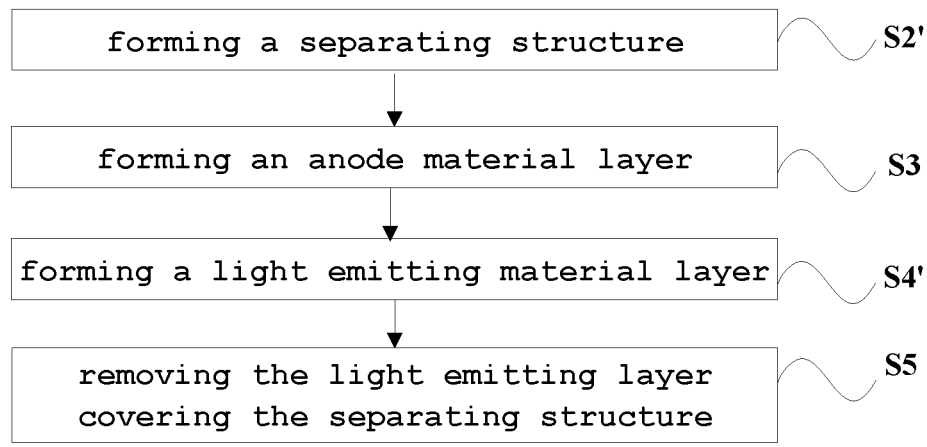
FIG. 3B is a flowchart illustrating a method of manufacturing an array substrate according to another embodiment of the present disclosure.
Figure 6A:
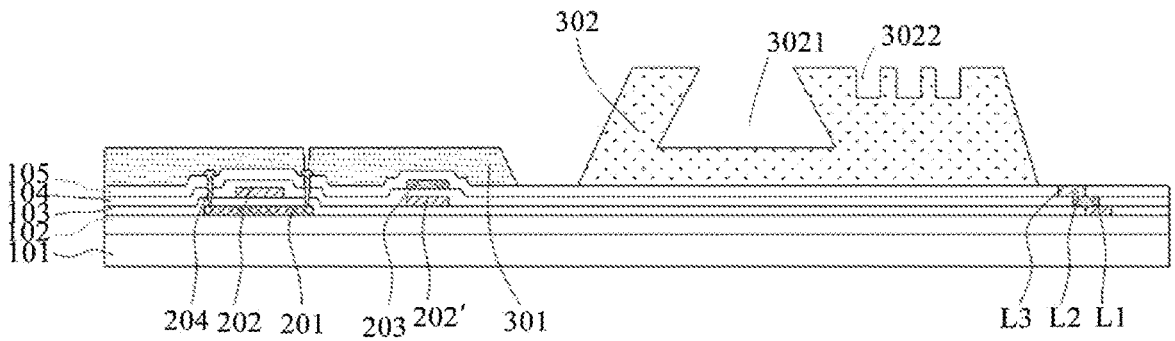
FIG. 6A-6C respectively are sectional views illustrating different manufacturing stages of an array substrate according to some other embodiments of the present disclosure.
Figure 6B:
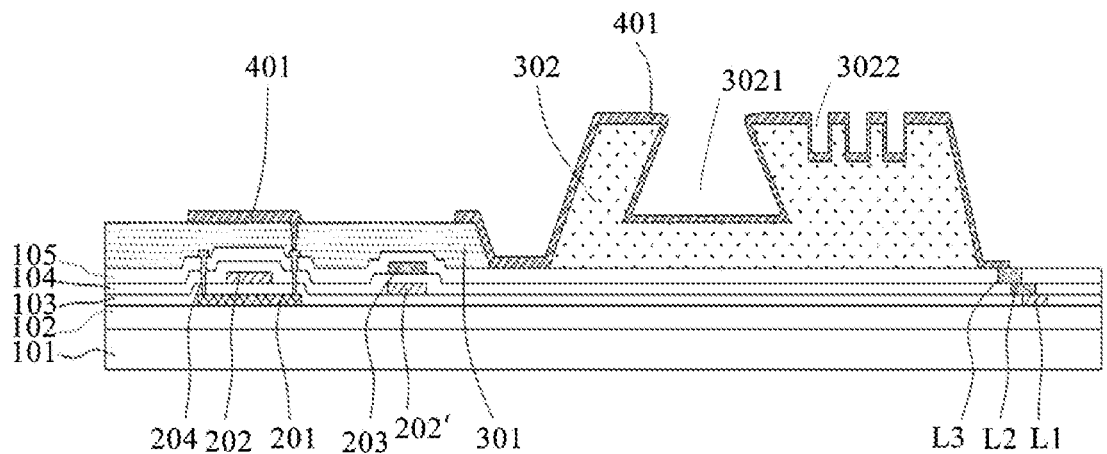
Figure 6C:
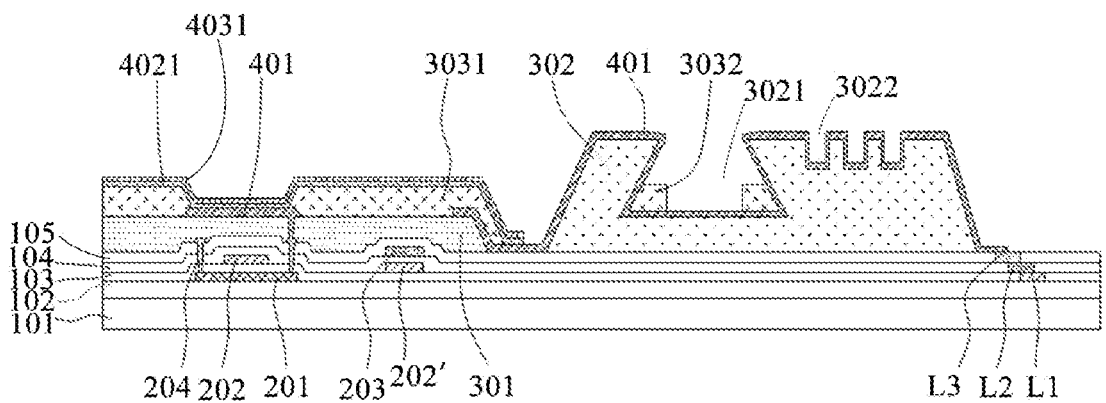

FIG. 3B is a flowchart illustrating a method of manufacturing an array substrate according to another embodiment of the present disclosure. FIGS. 6A-6C respectively are sectional views illustrating different manufacturing stages of an array substrate according to some further embodiments of the present disclosure. FIG. 3B differs from FIG. 3A mainly in that the anode material layer is formed after forming the separating structure. A method for manufacturing an array substrate according to another embodiment of the present disclosure will be described below with reference to FIGS. 3B and 6A-6D, 2B, and 2C, but only differences between FIG. 3B and FIG. 3A will be described, and the same parts will not be described again.

As shown in FIG. 3B, forming the display area includes: step S2', forming a separating structure; step S3, forming an anode material layer; step S4', forming a light emitting material layer. In FIG. 3B, after the separating structure is formed, an anode material layer is formed.

FIG. 6A is a sectional view illustrating the array substrate after the separating structure is formed in step ST. FIG. 6B is a sectional view illustrating the array substrate after the anode material layer is formed in step S3.

The separating structure shown in FIG. 6A is similar to the separating structure shown in FIG. 5F, and is also located in the separating region between the hole region and the pixel region including the TFT structure.

Prior to forming the anode material layer, the support layer 301 may be formed so as to provide a flat surface. As shown in FIG. 6A, the support layer 301 is disposed over the TFT structure and the capacitor structure 202', 203 to provide a planar surface for the formation of the anode material layer.

The anode material layer shown in FIG. 6B is different from the anode material layer shown in FIGS. 5E and 5F in that the anode material layer 401 completely covers the separating structure 302. That is, the anode material layer 401 covers the sidewalls and the bottom of the first groove 3021, including the base angle of the first groove.

In step S4', a light emitting material layer is formed. In some embodiments, a patterned pixel defining layer is formed after the anode material layer is formed and before the light emitting material layer is formed. As shown in FIG. 2C, the pixel defining layer includes: a first pixel defining layer 3031 formed at a position for separating the anode unit in the pixel region; and a second pixel defining layer 3032 at the base angle of the first groove 3021 in the separating region. This is because, in case where the base angle of the first groove is small, the pixel defining layer at the base angle position cannot be irradiated with light during the patterning of the pixel defining layer by the photolithography process, and thus the pixel defining layer at the base angle position is not removed by the photolithography process.

The light emitting material layer 402 may be formed in step S4' using an evaporation process similar to that in step S4. The light emitting material layer shown in FIG. 2C is similar to the light emitting material layer shown in FIG. 2A, and includes a first light emitting material layer 4021 and a second light emitting material layer 4022, wherein the first light emitting material layer 4021 is formed in the pixel region 10, covering the anode material layer 401 and the pixel defining layer 3031; the second light emitting material layer 4022 is formed in the separating region 30, partially covering the separating structure 302, not formed at the base angle and the sidewalls of the first groove 3021, and formed only in a part of the area on the bottom of the first groove 3021.

Also, after the light emitting material layer is formed, a cathode material layer may also be formed by a similar evaporation process. As shown in FIG. 2C, the cathode material layer is stacked over the light emitting material layer, and also includes a first cathode material layer 4031 and a second cathode material layer 4032, which are stacked over the first light emitting material layer 4021 and the second light emitting material layer 4022, respectively, and are not formed at the base angle and the sidewalls of the first groove 3021 either.

In some embodiments, forming the display area further comprises: step S5, removing the light emitting material layer covering the separating structure, for example, forming the structure shown in FIG. 6C. As shown in FIG. 6C, the first light emitting material layer 4021 is formed on the anode material layer 401, and no light emitting material layer exists on the separating structure 302. This can more effectively separating the pixel region from the hole and prevent extension of the failure of the light emitting material around the hole. Also shown in FIG. 6C is a first cathode material layer 4031 stacked on the first light emitting material layer 4021, but no cathode material layer is present on the separating structure 302.

After the functional layers of the separating region and the pixel region are formed, the hole region is etched by laser ablation or other etching processes to form a hole. In some embodiments, the light emitting material layer overlying the separating structure may be removed with a lower etch energy prior to forming the hole, and then the hole may be formed with a higher etch energy. Of course, the light emitting material layer covering the separating structure may also be removed by a separate etching process according to actual needs.

In some embodiments, an encapsulation structure may also be formed over the formed display area, such as the structure shown in FIG. 2B. The encapsulation structure shown in FIG. 2B is similar to that shown in FIG. 2A, and also covers the pixel region and the separating region.

According to an embodiment of the present disclosure, there is also provided a display panel including the array substrate according to any of the previous embodiments.

According to an embodiment of the present disclosure, there is also provided a display device including the display panel according to any of the previous embodiments. The display device may be a mobile phone, a tablet computer, a television set, a display, a notebook computer, a digital photo bezel, a navigator or any product or component with a display function.

Thus, various embodiments of the present disclosure have been described in detail. Some details well known in the art have not been described in order to avoid obscuring the concepts of the present disclosure. It will be fully apparent to those skilled in the art from the foregoing description how to carry out the technical solutions disclosed herein.

Although some specific embodiments of the present disclosure have been described in detail by way of example, it should be understood by those skilled in the art that the foregoing examples are for purposes of illustration only and are not intended to limit the scope of the present disclosure. It will be understood by those skilled in the art that modifications may be made to the above embodiments or equivalents may be substituted for some technical features thereof without departing from the scope and spirit of the present disclosure. The scope of the present disclosure is defined by the appended claims.

What is claimed is:

1. An array substrate, comprising:
    a substrate structure;
    a first light emitting material layer located at a pixel region, at which a pixel defining layer is located, wherein the first light emitting material layer is located on the substrate structure; and
    a separating structure located at a separating region, wherein the separating structure is located on the substrate structure and comprises at least one first groove, and the at least one first groove is configured to separate the first light emitting material layer from a hole, wherein the hole is located at a hole region, the separating region surrounds the hole region, and the pixel region surrounds the separating region, and orthographic projections of the pixel region, the separating region, and the hole region on the substrate structure do not overlap with each other.

2. The array substrate according to claim 1, wherein an angle between at least one side surface of the separating structure and a bottom surface of the separating structure close to the substrate structure is less than or equal to 90°.

3. The array substrate according to claim 2, wherein a cross section of the at least one first groove in a direction perpendicular to the substrate structure is a quadrilateral, of which at least one base angle close to the substrate structure is less than or equal to 90°.

4. The array substrate according to claim 3, further comprising:
    a second light emitting material layer located at the separating region and partially covering the separating structure and being broken at the at least one base angle of the at least one first groove close to the substrate structure.

5. The array substrate according to claim 4, further comprising:
    an anode material layer located at the separating region and disposed between the second light emitting material layer and the separating structure.

6. The array substrate according to claim 2, wherein the separating region further comprises:
    a metal stack disposed around the hole region, and located between the separating structure and the hole region.

7. The array substrate according to claim 6, wherein the pixel region further comprises:
    a thin film transistor structure located between the first light emitting material layer and the substrate structure, the thin film transistor structure comprising a gate electrode, a source electrode, and a drain electrode;
    wherein the metal stack comprises a first metal layer and a second metal layer made of a same material as the gate electrode and the source electrode of the thin film transistor structure, respectively.

8. The array substrate according to claim 7, wherein the pixel region further comprises:
    a capacitor structure located between the first light emitting material layer and the substrate structure, and between the separating structure and the thin film transistor structure, wherein the capacitor structure comprises a first electrode layer and a second electrode layer, and the first electrode layer is made of a same material as the gate electrode of the thin film transistor structure;
    wherein the metal stack comprises a third metal layer made of a same material as the second electrode layer of the capacitor structure.

9. The array substrate according to claim 2, wherein the separating structure further comprises:
    at least one second groove, a depth of which in a direction perpendicular to the substrate structure is less than a depth of the at least one first groove, wherein an orthographic projection area of the at least one second groove on the substrate structure is smaller than an orthographic projection area of the at least one first groove on the substrate structure.

10. The array substrate according to claim 2, wherein the hole region has the hole, and the hole extends through the substrate structure.

11. The array substrate according to claim 3, wherein the at least one base angle of the quadrilateral close to the substrate structure is in a range of 30° to 70°.

12. The array substrate according to claim 11, wherein the quadrilateral is a trapezoid.

13. The array substrate according to claim 1, wherein the separating region further comprises:
    an anode material layer at least partially covering the separating structure.

14. A display panel comprising the array substrate according to claim 1.

15. A method of manufacturing an array substrate, comprising:

forming a separating structure on one side of a substrate structure, wherein the separating structure is located in a separating region surrounding a hole region and has at least one first groove; and forming a first light emitting material layer on the one side of the substrate structure, wherein the first light emitting material layer is located in a pixel region, at which a pixel defining layer is located, and wherein the pixel region surrounds the separating region, and the at least one first groove separates the first light emitting material layer from the hole region, and wherein orthographic projections of the pixel region, the separating region, and the hole region on the substrate structure do not overlap with each other.

16. The method of manufacturing according to claim 15, wherein a light emitting material layer is formed by an evaporation process, a portion of the light emitting material layer located in the pixel region serves as the first light emitting material layer, a portion of the light emitting material layer located in the separating region serves as a second light emitting material layer, and the second light emitting material layer partially covers the separating structure and is not formed at a base angle of the at least one first groove close to the substrate structure.

17. The method of manufacturing according to claim 16, wherein the second light emitting material layer is not formed at a sidewall of the at least one first groove.

18. The method of manufacturing according to claim 16, further comprising at least one of the following steps of:

forming an anode material layer before forming the separating structure; or forming the anode material layer at least partially covering the separating structure, after forming the separating structure and before forming the light emitting material layer.

19. The method of manufacturing according to claim 18, further comprising at least one of the following steps of:

removing the second light emitting material layer covering the separating structure;

forming a metal stack located in the separating region, between the separating structure and the hole region, and comprising a first metal layer and a second metal layer; or etching the hole region to form a hole.

20. The method of manufacturing according to claim 19, further comprising:

forming a thin film transistor structure before forming the light emitting material layer, the thin film transistor structure being located in the pixel region and comprising a gate electrode, a source electrode, and a drain electrode, wherein the first metal layer and the second metal layer of the metal stack are formed through the same patterning process with the gate electrode and the source electrode of the thin film transistor structure, respectively.

* * * * *